US 9,800,217 B1

(12) United States Patent
Gandolfi et al.

(10) Patent No.: US 9,800,217 B1
(45) Date of Patent: Oct. 24, 2017

(54) INTEGRATED AMPLIFIER SYSTEM (71) Applicant: Marvell International Ltd., Hamilton (BM)

(72) Inventors: Gabriele Gandolfi, Siziano (IT); Vittorio Colonna, San Martino Siccomario (IT); Francesco Rezzi, Cava Manara (IT)

(73) Assignee: Marvell International Ltd., Hamilton (BM)

( * ) Notice: Subject to any disclaimer, the term of this patent is extended or adjusted under 35 U.S.C. 154(b) by 218 days.

(21) Appl. No.: 14/633,086

(22) Filed: Feb. 26, 2015

Related U.S. Application Data

(60) Provisional application No. 61/945,090, filed on Feb. 26, 2014.

(51) Int. Cl.
  *H03F 99/00* (2009.01)
  *H03F 3/45* (2006.01)
  *H03F 3/183* (2006.01)
  *H04R 3/00* (2006.01)

(52) U.S. Cl.
  CPC ......... *H03F 3/45076* (2013.01); *H03F 3/183* (2013.01); *H04R 3/00* (2013.01); *H03F 2200/03* (2013.01); *H03F 2200/165* (2013.01); *H03F 2200/171* (2013.01); *H03F 2203/45116* (2013.01)

(58) Field of Classification Search
  CPC .................................................. H03F 2200/03
  USPC ........................................... 330/85, 109, 110
  See application file for complete search history.

(56) References Cited

U.S. PATENT DOCUMENTS

| | | | | |
|---|---|---|---|---|
| 6,573,785 | B1 * | 6/2003 | Callicotte | H03F 3/45475 327/554 |
| 6,803,825 | B2 * | 10/2004 | Chiou | H03F 3/087 250/214 A |
| 2003/0181188 | A1 * | 9/2003 | Darabi | H04B 1/406 455/313 |

(Continued)

FOREIGN PATENT DOCUMENTS

CA        2167219       *  1/1997

OTHER PUBLICATIONS

James Karki, Texas Instruments, Application Report SLOA054D, Fully-Differential Amplifiers, Jan. 2002.

(Continued)

*Primary Examiner* — Joseph Saunders, Jr.
*Assistant Examiner* — James Mooney (57) ABSTRACT

Technologies are described to DC-couple an integrated amplifier system to a source that provides a signal with an unknown DC component, for example to DC-couple an integrated audio codec to an analog microphone. In one aspect, methods include receiving, by an amplifier, a signal having an unknown DC component, and issuing an amplified signal; low pass filtering, with respect to a cutoff frequency, by a feedback circuit coupled between an output of the amplifier and an input of the amplifier, the amplified signal issued at the output of the amplifier to generate a filtered signal having frequencies lower than the cutoff frequency; and injecting, by the feedback circuit, the filtered signal into the input of the amplifier to cancel the unknown DC component below the cutoff frequency.

18 Claims, 8 Drawing Sheets

(56) References Cited

U.S. PATENT DOCUMENTS

| | | | | |
|---|---|---|---|---|
| 2004/0251947 A1* | 12/2004 | Wang | ............... | H03F 3/45748 |
| | | | | 327/307 |
| 2007/0076904 A1* | 4/2007 | Deruginsky | .......... | H03F 1/3211 |
| | | | | 381/95 |
| 2011/0051954 A1* | 3/2011 | Thomsen | ............... | H03F 3/34 |
| | | | | 381/93 |
| 2015/0022268 A1* | 1/2015 | Kao | ................ | H03F 3/45071 |
| | | | | 330/259 |

OTHER PUBLICATIONS

Thomas Kugelstadt, Texas Instruments, Literature No. SLOA088, Chapter 16: Active Design Techniques, excerpted from Op Amps for Everyone, Literature No. SLOD006A, 2008.

* cited by examiner

Fig. 4A $\Phi_1$ = OFF AND $\Phi_2$ = ON

Fig. 4B $\Phi_1$ = ON AND $\Phi_2$ = OFF

INTEGRATED AMPLIFIER SYSTEM

CROSS-REFERENCE TO RELATED APPLICATIONS

This disclosure claims priority to U.S. Provisional Application Ser. No. 61/945,090 titled "TECHNIQUE TO REALIZE A MICROPHONE DC-COUPLING INSIDE AUDIO CODEC FOR MOBILE APPLICATIONS," filed on Feb. 26, 2014, the disclosure of which is incorporated herein by reference in its entirety.

FIELD OF TECHNOLOGY

The present disclosure is generally related to an integrated amplifier system to be DC-coupled to a signal source that provides a signal with an unknown DC component, for example an audio codec that can be DC-coupled to an analogue microphone.

BACKGROUND

A signal output by a source can be converted to a digital signal to be stored or retransmitted. An amplifier is typically used to amplify the signal prior to digitizing the amplified signal. Such an amplifier can be packaged in an integrated circuit that is coupled with the source. The signal includes a plurality of components having finite (non-zero) frequencies and, often, it also includes a DC component. In case only a portion of the signal having the components with finite frequencies is desired to be digitized, the DC component is removed from the signal and only the desired portion is input to the amplifier. If a value of the DC component of the signal is known, then a DC voltage with a value equal to the known DC component is subtracted from the signal, and the obtained difference signal is input to the amplifier. Here, the difference signal can be generated outside or inside the integrated circuit. If the value of the DC component of the signal is unknown, then the amplifier is AC-coupled with the source via one or more capacitors located outside the integrated circuit. Hence, the unknown DC component of the signal is filtered out and a filtered signal is generated outside the integrated circuit. The filtered signal generated in this manner is then input to the amplifier.

SUMMARY

Technologies described in this specification can be used to DC-couple an integrated amplifier system to a signal source that outputs a signal with an unknown DC component. The disclosed amplifier system can be implemented as an integrated circuit that includes an amplifier and a feedback loop. Here, the feedback loop generates, at an input of the amplifier inside the integrated circuit, a feedback signal that counterbalances the unknown DC component. In this manner, the amplifier amplifies a portion of the signal having only components with finite (non-zero) frequencies. In some implementations, the source can be an analogue microphone and the integrated circuit can be implemented as an audio codec.

One aspect of the subject matter described in this specification can be implemented as an amplification system that includes an amplifier configured and arranged to receive a signal having an unknown DC component, and issue an amplified signal; and a feedback circuit coupled between an output of the amplifier and an input of the amplifier. The feedback circuit is configured to low pass filter, with respect to a cutoff frequency, the amplified signal issued at the output of the amplifier to generate a filtered signal having frequencies lower than the cutoff frequency, and inject the filtered signal into the input of the amplifier to cancel the unknown DC component below the cutoff frequency.

Implementations can include one or more of the following features. In some implementations, the feedback circuit can include an active integrator circuit. The active integrator circuit can include an operational amplifier, a resistive element connected to an inverting input of the operational amplifier, and a capacitive element connected between an output of the operational amplifier and the inverting input of the operational amplifier. In some cases, the capacitive element can include a capacitor having a capacitance value that causes a ratio of noise generated by the feedback circuit, at the input of the amplifier, to a portion of the received signal at the frequencies above the cutoff frequency, to be less than a predetermined ratio value. In some cases, the received signal can include audio frequency components from an audio frequency spectrum, and the resistive element can include a switched capacitor that is switched at a switching frequency 10 to 100 times larger than an upper bound of the audio frequency spectrum. Here, a combination of the switching frequency and capacitance value of the switched capacitor causes the cutoff frequency to be less than a lower bound of the audio frequency spectrum.

In some implementations, the received signal can be a differential voltage across first and second nodes of an electrical circuit, such that a voltage bias of the first node is higher than a voltage bias of the second node by the unknown DC component of the received signal. In such cases, the amplifier can include a non-inverting amplifier input connected to the first node of the electrical circuit, and an inverting amplifier input. Additionally, the feedback circuit can include a first feedback input connected to the output of the amplifier, a second feedback input connected to the second node of the electrical circuit, and a feedback output connected to the inverting amplifier input where the filtered signal is injected by the feedback circuit. For instance, the first and second nodes of the electrical circuit are terminals of a microphone circuit element, and the received signal includes audio frequency components. Moreover, the amplification system can be included in an audio codec integrated on a circuit chip. For example, the amplifier can include two amplifier outputs where respective amplified signals are issued, and the audio codec integrated on the circuit chip can include an analog-to-digital converter connected with amplifier outputs to convert a difference of the amplified signals to a digital signal. As another example, the audio codec integrated on the circuit chip can include a detection circuit connected to the non-inverting amplifier input to compare the unknown DC component to a target DC voltage, such that the amplifier, the feedback circuit or both can be powered ON or OFF in accordance with a result of the comparison.

Another aspect of the current disclosure can be implemented in methods including receiving, by an amplifier, a signal that includes an unknown DC component, and issuing an amplified signal; low pass filtering, with respect to a cutoff frequency, by a feedback circuit coupled between an output of the amplifier and an input of the amplifier, the amplified signal issued at the output of the amplifier to generate a filtered signal having frequencies lower than the cutoff frequency; and injecting, by the feedback circuit, the filtered signal into the input of the amplifier to cancel the unknown DC component below the cutoff frequency.

Implementations can include one or more of the following features. In some implementations, the methods can include maintaining, by the feedback circuit at the input of the amplifier, a ratio of noise generated by the feedback circuit to a portion of the received signal having frequencies above the cutoff frequency below a predetermined ratio value. In some implementations, the methods can include switching a switched capacitor of the feedback circuit at frequencies larger by a predetermined factor than an upper bound of a frequency spectrum of the received signal.

In some implementations, the cutoff frequency with respect to which the low pass filtering is performed is less than a lower bound of a frequency spectrum of the received signal. In some implementations, the methods can include issuing, by the amplifier, two amplified signals at respective outputs of the amplifier; and converting, by an analog-to-digital convertor connected with the outputs of the amplifier, a difference of the amplified signals to a digital signal.

In some implementations, the signal can be received by the amplifier at a non-inverting input and the filtered signal can injected by the feedback circuit at an inverting input of the amplifier. Here, the methods can include determining, by a detection circuit connected to the input of the amplifier, whether the unknown DC component meets a target DC voltage; and in response to determining that the unknown DC component meets a target DC voltage, causing that the amplifier, the feedback circuit or both be powered ON or be maintained in a power ON state, or else causing that the amplifier, the feedback circuit or both to be powered OFF or be maintained in a power OFF state.

Yet another aspect of the subject matter described in this specification can be implemented as an integrated circuit that includes a first input port and a second input port, where the first input port to receive a voltage that has an unknown DC voltage; and an audio codec circuit. The audio codec circuit includes an amplifier including an inverting amplifier input, a non-inverting amplifier input, one or more amplifier outputs, and a negative feedback loop. The non-inverting amplifier input is coupled to the first input port and the negative feedback loop is connected to the second input port. Additionally, the negative feedback loop includes an active integrator circuit configured to generate at the inverting amplifier input a feedback DC that counterbalances the unknown DC voltage, such that one or more amplified voltages issued by the amplifier at the respective one or more amplifier outputs have only components with finite frequencies.

Implementations can include one or more of the following features. In some implementations, the active integrator circuit can include an operational amplifier, a switched capacitor connected to an inverting input of the operational amplifier, and an integrator capacitor connected between an output of the operational amplifier and the inverting input of the operational amplifier. In some cases, the integrator capacitor can be a metal-oxide-semiconductor capacitor. Further, a capacitance of the integrator capacitor can be between 10-45 pF, such that noise generated by the active integrator circuit at the inverting amplifier input is less than $5\mu$ VRMS. For example, the capacitance of the integrator capacitor is 45 pF and the noise has a maximum value of $2\mu$ VRMS. Furthermore, an upper bound of a frequency range of the received voltage can be in a range of 8-20 kHz, and the switched capacitor is switched at a switching frequency in the range of 80 kH to 200 kH. Moreover, the active integrator can be arranged and configured to provide a low pass filter associated with a cutoff frequency to the one or more amplified voltages, and a capacitance of the switched capacitor can be in a range of 5-100 fF such that an effective resistance of the switched capacitor causes the cutoff frequency to be less than 200 Hz. For example, the capacitance of the switched capacitor is in a range of 8-80 fF for a cutoff frequency of 25 Hz.

In some implementations, the received voltage can be a differential voltage across first and second nodes of a microphone circuit, and the first port is connected to the first node of the microphone circuit and the second port is connected to the second node of the microphone circuit. Additionally, the negative feedback loop can include a first feedback input connected to one of the one or more amplifier outputs, a second feedback input connected to the second port, and a feedback output connected to the inverting amplifier input where the DC feedback voltage is generated by the negative feedback loop.

In some implementations, the audio codec circuit further can include an analog-to-digital converter connected with the one or more amplifier outputs to convert the one or more amplified voltages to corresponding digital signals. In some implementations, the audio codec circuit can include a detection circuit connected to the first input port to compare the unknown DC voltage to a target DC voltage, such that the amplifier is to be powered ON or OFF in accordance with a result of the comparison.

In some implementations, the amplifier can be a programmable gain amplifier. In some implementations, the amplifier can be a fully-differential amplifier.

The disclosed technologies can result in one or more of the following advantages. An audio processing system, which includes the disclosed audio codec circuit to be DC-coupled to a signal source, has a smaller area compared to the area of another audio processing system which includes a conventional audio codec circuit that is AC-coupled to the signal source via one or more external capacitors. This area reduction is due to the fact that extra silicon area added by the feedback loop to the disclosed audio codec circuit is smaller than an area saved by not using in the disclosed audio processing system the external capacitor(s) required by the conventional audio processing system.

Moreover, the number of pins (or input ports) associated with an audio processing system has a significant influence on the size and cost of the audio processing system' package. Removal of the external capacitor(s) in accordance with the disclosed technologies allows for one pin associated with the audio processing system to be saved. When a signal that has an unknown DC component is applied at a given pin associated with the disclosed audio processing system, a microphone detection circuit included in the disclosed audio processing system detects the unknown DC component at the given pin. As the microphone detection circuit does not require a dedicated pin in accordance with the disclosed technologies, a corresponding input pad associated with the dedicated pin also is saved relative to the conventional audio processing system' package. Hence, the size and cost of the disclosed audio processing system are further reduced relative to the size and cost of the conventional audio processing system.

Additionally, because a portion of the amplified signal that includes components with finite (non-zero) frequencies is blocked by (and, thus, does not go through) the feedback loop, the feedback loop need not operate in a linear regime to be effective. This allows use of smaller and less expensive components for the feedback loop. In this manner, the extra silicon area of the feedback loop and the extra cost added by the feedback loop to the disclosed audio codec circuit relative to the area and cost of the conventional audio codec circuit can be kept below threshold values. Further, as an amplification system of the disclosed audio codec circuit can operate as an active high pass filter, its offset need not be critical. Thus, in some implementations, the only constraint of the amplification system is a dynamic limitation of the amplifier.

Furthermore, the disclosed switching associated with a switched capacitor used as an effective resistance of the feedback loop allows for a fully differential operational amplifier of the feedback loop to operate in single ended mode. In this manner, a dedicated stage of the fully differential operational amplifier need not be used and, as a consequence, silicon area and power consumption of the feedback loop are saved. In addition, using a switched capacitor instead of a resistor to accomplish a 0.5 GΩ or larger effective resistance of the feedback loop, further reduces the silicon area of the feedback loop.

The above potential advantages of the amplification system of the disclosed audio codec circuit are achieved at the expense of some additional power consumed by the operational amplifier of the feedback loop. However, this additional power consumption can be used at the input stages of the amplification system to mitigate overall system noise.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
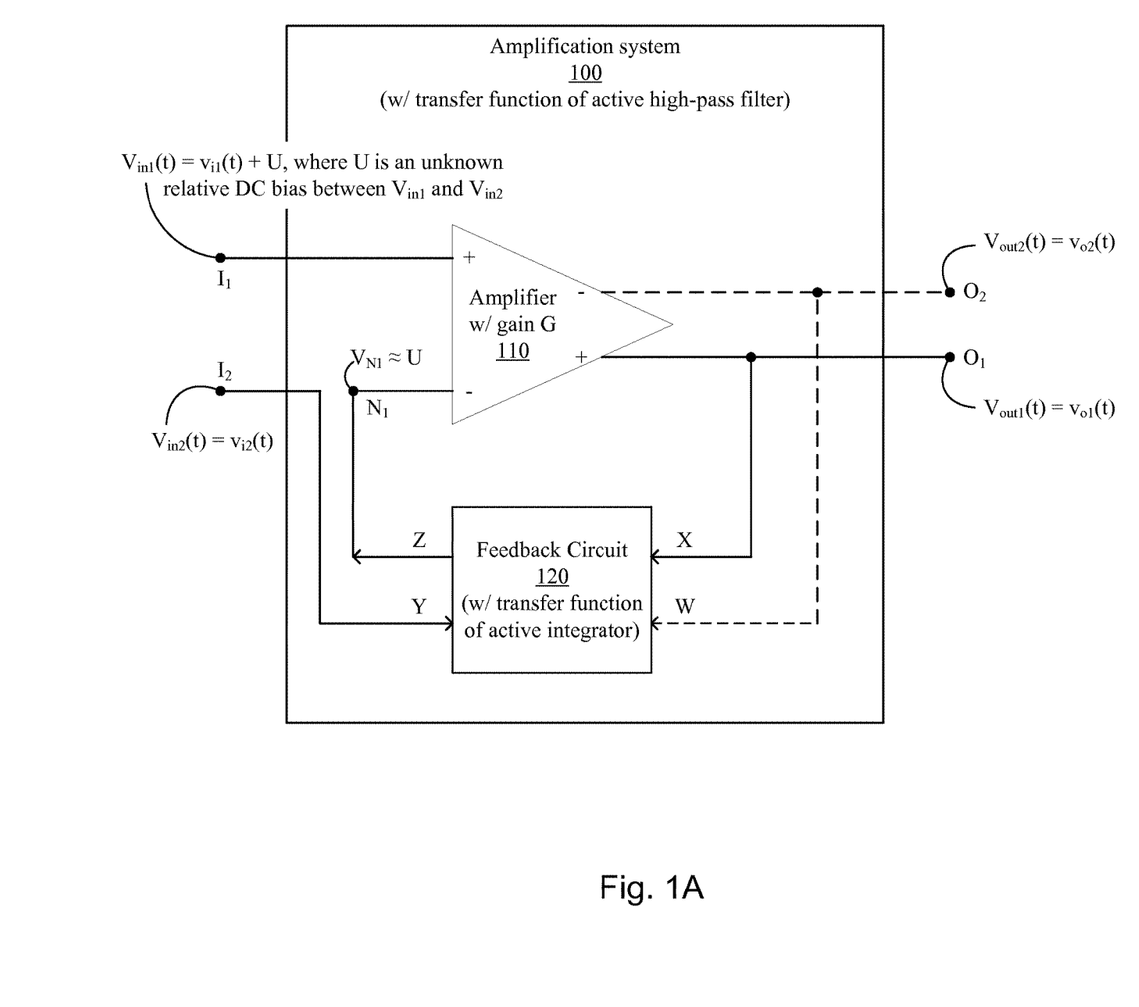
FIGS. 1A-1D show aspects of an example of an amplification system that can be DC-coupled to a source providing a signal with an unknown DC component.

FIG. 1A shows an example of an amplification system 100 that can be DC-coupled to a source providing a signal with an unknown DC component. The amplification system includes an amplifier 110 with gain G and a feedback loop 120 (also referred to, interchangeably, as a feedback circuit 120.) The amplifier 110 is arranged and configured to receive a signal that includes an unknown DC component U, and to issue an amplified signal. The feedback circuit 120 is coupled between an output of the amplifier 110 and an input of the amplifier. The feedback circuit 120 is configured to low pass filter, with respect to a cutoff frequency $f_C$, the amplified signal issued at the output of the amplifier 110 to generate a filtered signal having frequencies lower than the cutoff frequency $f_C$. Additionally, the feedback circuit 120 is configured to inject the filtered signal into the input of the amplifier 110 to cancel the unknown DC component U below the cutoff frequency.

In some implementations, the received signal can be a differential voltage across first and second nodes of an electrical circuit (not shown in FIG. 1A), where a voltage bias of the first node is higher than a voltage bias of the second node by the unknown DC component U of the received signal. In the example illustrated in FIG. 1A, a first input $I_1$ of the amplification system 100 is connected to the first node of the electrical circuit and a second input $I_2$ of the amplification system 100 is connected to the second node of the electrical circuit. In this manner, a first input voltage $V_{in1}(t)$ at the first input $I_1$ of the amplification system 100 is $V_{in1}(t)=v_{i1}(t)+U$, and a second input voltage $V_{in2}(t)$ at the second input $I_2$ of the amplification system 100 is $V_{in2}(t)=v_{i2}(t)$. Here, the unknown DC component U represents a relative DC bias between $V_{in1}(t)$ and $V_{in2}(t)$. Additionally, $v_{inj}(t)$, where j=1 or 2, represents a portion of the $j^{th}$ input voltage $V_{inj}(t)$ that varies in time and, hence, includes only components with finite (non-zero) frequencies.

Further in the example illustrated in FIG. 1A, the amplifier 110 has a non-inverting input connected to the first input $I_1$ of the amplification system 100 and an inverting input $N_1$. Also, the amplification system 100 has a first output $O_1$ connected to a first output of the amplifier 110. As such, a first amplified signal $V_{out1}(t)$ is issued by the amplifier 110 at the first output $O_1$. Optionally, the amplification system 100 has a second output $O_2$ connected to a second output of the amplifier 110. In the latter case, a second amplified signal $V_{out2}(t)$ is issued by the amplifier 110 at the second output $O_2$ concurrently with the first amplified signal $V_{out1}(t)$ issued at the first output $O_1$.

Furthermore in the example illustrated in FIG. 1A, the feedback circuit 120 has a first feedback input X connected to the first output $O_1$ of the amplifier 110 and a second feedback input Y connected to the second input $I_2$ of the amplification system 100. Also, the feedback circuit 120 has a feedback output Z connected to the non-inverting input $N_1$ of the amplifier 110. Optionally, the feedback circuit 120 has a third input W connected to the optional second output $O_2$ of the amplifier 110. As described above, the feedback circuit 120 is configured as a low pass filter that blocks components with frequencies larger than the cutoff frequency $f_C$ of the first amplified signal $V_{out1}(t)$ issued at the first output $O_1$. In this manner, the first amplified signal $V_{out1}(t)$ issued at the first output $O_1$ is $V_{out1}(t)=v_{out1}(t)$ and contains only components with frequencies larger than the cutoff frequency $f_C$. Similarly, when the second output $O_2$ is available, the second amplified signal $V_{out2}(t)$ issued at the second output $O_2$ is $V_{out2}(t)=v_{out2}(t)$ and contains only components with frequencies larger than the cutoff frequency $f_C$.

Moreover, the filtered signal generated by the feedback circuit 120 at the feedback output Z includes only components with frequencies less than or equal to the cutoff frequency $f_C$. In this manner, the filtered signal provided at the inverting input $N_1$ of the amplifier 110 counterbalances the unknown DC component U of the first input voltage $V_{in1}(t)$.

Figure 1B:
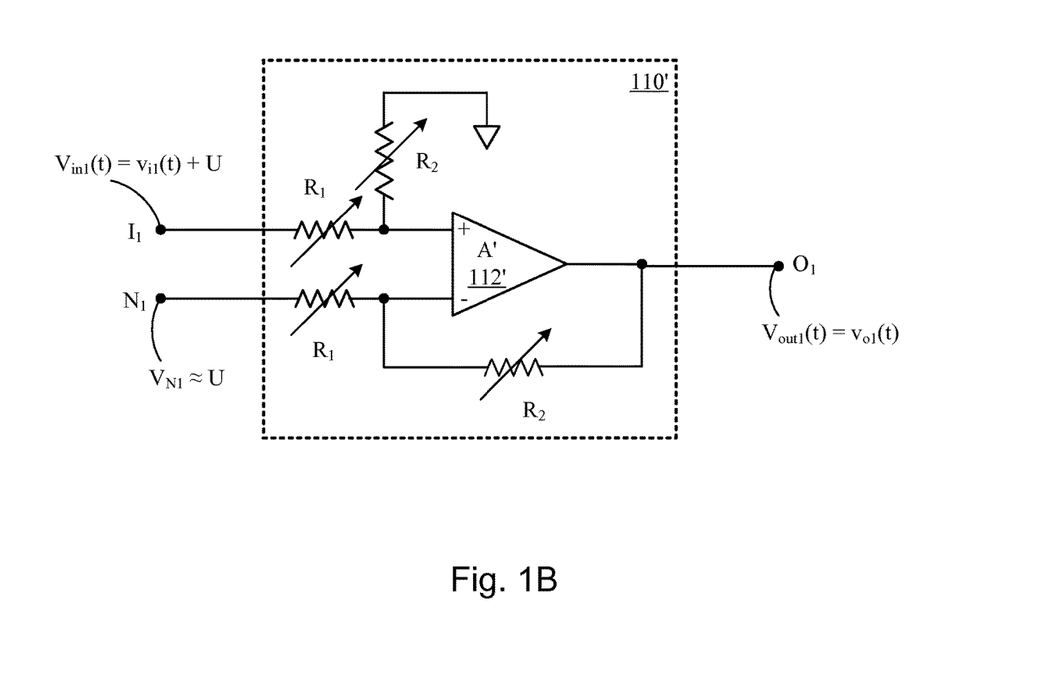
Figure 1C:
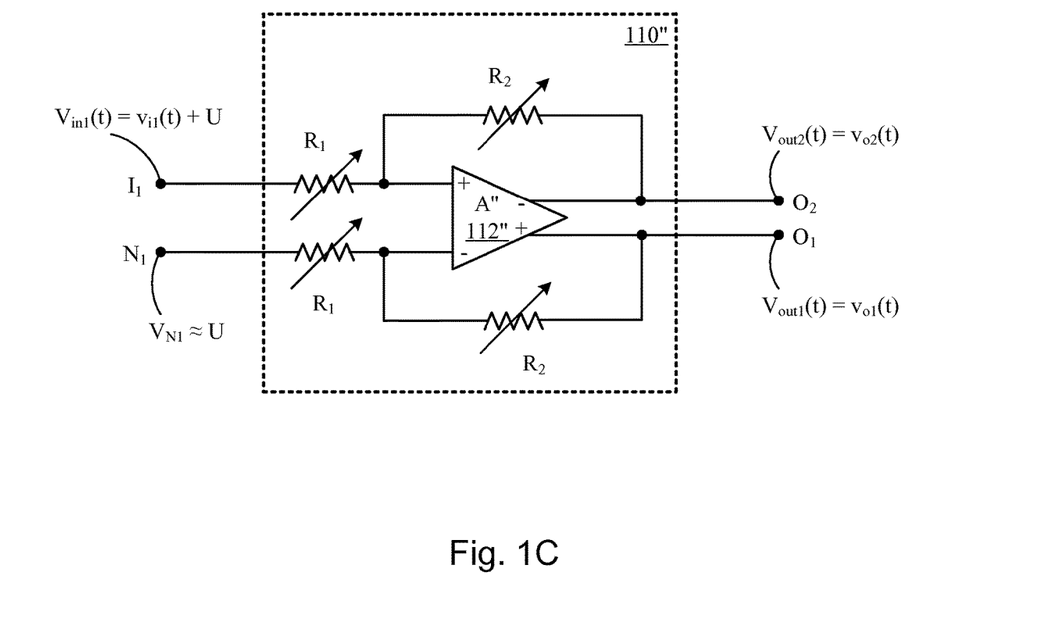

FIG. 1B shows an example of the amplifier 110 implemented as a standard differential amplifier 110' and FIG. 1C shows an example of the amplifier 110 implemented as a fully-differential amplifier 110". The standard differential amplifier 110' has differential inputs $I_1$ and $N_1$ connected via resistors $R_1$ with respective non-inverting and inverting inputs of an operational amplifier 112' having open loop gain A'. Similarly, the fully-differential amplifier 110" has differential inputs $I_1$ and $N_1$ connected via resistors $R_1$ with respective non-inverting and inverting inputs of an operational amplifier 112" having open loop gain A". The standard differential amplifier 110' has a single ended output $O_1$, while the fully-differential amplifier 110" has differential outputs $O_1$ and $O_2$. There is a single feedback path from the single ended output $O_1$ via resistor $R_2$ to the inverting input of the operational amplifier 112' in the standard differential amplifier 110'. In contrast, the fully-differential amplifier 110" has a first feedback path from the first output $O_1$ via resistor $R_2$ to the inverting input of the operational amplifier 112" and a second feedback path from the second output $O_2$ via resistor $R_2$ to the non-inverting input of the operational amplifier 112". The gain G of the standard differential amplifier 110' is given by $$G = \frac{V_{out1}(t)}{V_{in1}(t) - V_{in2}(t)} = \frac{R_2}{R_1}, \quad (1)$$

where an amplified voltage $V_{out1}(t)$ issued at the single ended output $O_1$ is proportional to an input differential voltage $V_{in1}(t)-V_{in2}(t)$ applied between the differential inputs $I_1$ and $N_1$. Similarly, the gain G of the fully-differential amplifier 110" is given by $$G = \frac{V_{out1}(t) - V_{out2}(t)}{V_{in1}(t) - V_{in2}(t)} = \frac{R_2}{R_1}, \quad (2)$$

where an amplified differential voltage $V_{out1}(t)-V_{out2}(t)$ issued between the differential outputs $O_1$ and $O_2$ is proportional to an input differential voltage $V_{in1}(t)-V_{in2}(t)$ applied between the differential inputs $I_1$ and $N_1$. In case the standard differential amplifier 110' or the fully-differential amplifier 110" is implemented as a programmable gain amplifier, the gain G can be changed in a programmable manner by changing the ratio of the resistors $R_1$ and $R_2$.

Figure 1D:
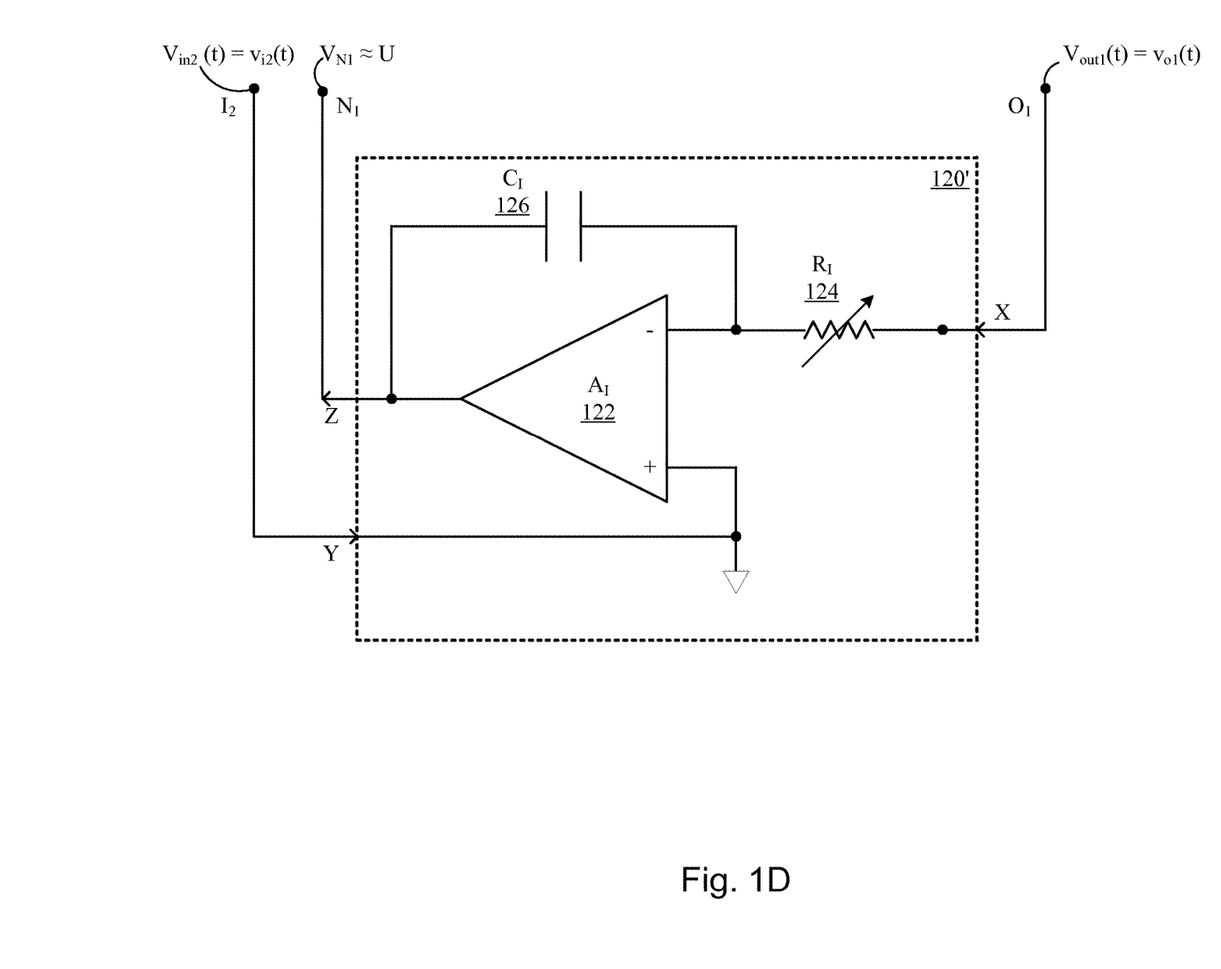

FIG. 1D shows an implementation of the feedback circuit 120 as an active integrator 120'. Here, the active integrator 120' includes an operational amplifier 122 having an open-loop gain $A_I$; a resistive element 124 having a resistance $R_I$ and being connected between the first feedback input X of the active integrator 120' and an inverting input of the operational amplifier 122; and a capacitive element 126 having a capacitance $C_I$ and being connected between the inverting input of the operational amplifier 122 and the feedback output Z of the active integrator 120'. Note that in the example illustrated in FIG. 1D, the second feedback input Y of the active integrator 120' is connected to the non-inverting input of the operational amplifier 122, which in turn is connected to ground.

A transfer function of the amplification system 100 illustrated in FIG. 1A having the amplifier 110 with gain G and the feedback circuit 120 implemented as the active integrator 120' illustrated in FIG. 1D can be expressed as:

$$\frac{V_{out,diff}}{V_{in,se}} = \frac{sG}{s + \frac{GR_I}{C_I}}. \quad (3)$$

Equation (3) indicates that the transfer function of the amplification system 100 is zero at DC (for s=0) and has a pole at $GR_I/C_I$. As such, the amplification system 100 having a transfer function given by Equation (3) operates like a high pass filter with a cutoff frequency $f_C=GR_I/C_I$. In case the amplifier 110 is implemented as a programmable gain amplifier, in which the gain G can be changed in a programmable manner, the product $GR_I$ must be maintained constant in order for the cutoff frequency $f_C$ of the amplification system 100 to remain constant. This can be accomplished by using a resistive element 124 with adjustable resistance $R_1$. In some cases, the resistive element 124 can be implemented as a resistor having resistance $R_1$. In other cases, the resistive element 124 can be implemented as a capacitor with capacitance $C_S$ that is switched with a switching frequency $f_S$, such that the switched capacitor has an effective resistance $R_1=1/f_S C_S$.

Noise provided by the active integrator 120' to the non-inverting input $N_1$ of the amplifier 110 has a contribution from the operational amplifier 122 and a $k_B T/C_1$ contribution. Here, $k_B$ is Boltzmann's constant and T is absolute temperature. The $k_B T/C_1$ noise contribution can be mitigated by using a minimum capacitance $C_1$ for which this noise contribution is less than a maximum acceptable noise value of $2\mu\ V_{RMS}$, for instance. Similarly, as the operational amplifier 122 has a unitary transfer function, its noise contribution can be mitigated by using a low noise operational amplifier for which the total noise integrated between the cutoff frequency $f_C$ and a maximum frequency $f_{MAX}$ of a frequency range $[f_C, f_{MAX}]$ of interest is less than a maximum acceptable noise value of $2\mu\ V_{RMS}$, for instance. An example of the frequency range $[f_C, f_{MAX}]$ of interest is an audio frequency range starting at about 200 Hz and extending up to about 20 kHz, for instance. As such, the amplification system 100 can be used to amplify audio signals received from an audio frequency source, when the audio signals include an unknown DC component.

Figure 2:
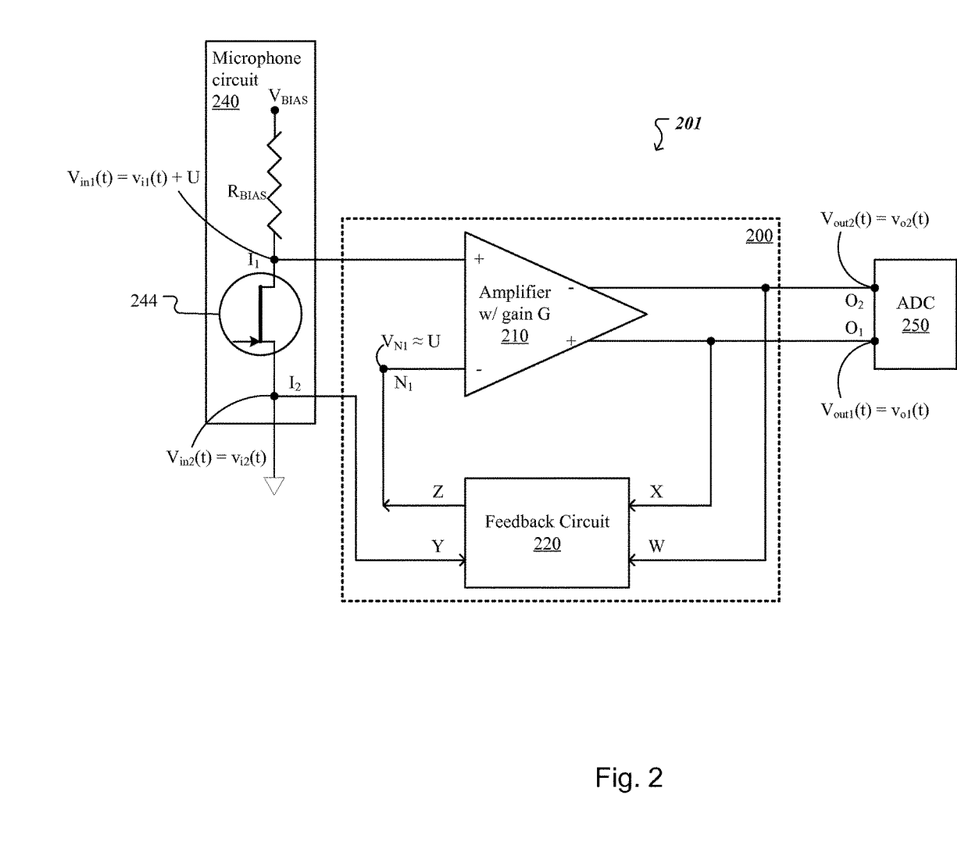
FIG. 2 shows an example of an audio processing system in which the amplification system from FIG. 1A that is DC-coupled to an audio source that provides a signal with an unknown DC component.

FIG. 2 shows an example of an audio processing system 201 in which an amplification system 200 is DC-coupled to an audio source 240 that provides an audio signal with an unknown DC component. Here, the audio signal with the unknown DC component is provided as an input differential voltage $V_{in1}(t)-V_{in2}(t)$ over differential inputs $I_1$ and $I_2$ of the amplification system 200. In addition to the amplifier system 200, the audio processing system 201 includes an analog-to-digital convertor (ADC) 250 to convert an amplified differential voltage $V_{out1}(t)-V_{out2}(t)$ issued by the amplification system 200 at differential outputs $O_1$ and $O_2$ to a digital signal.

The amplification system 200 can be the amplification system 100 described above in connection with FIGS. 1A-1D. Here, the amplifier 210 with gain G is implemented as a fully-differential amplifier as described above in connection with FIG. 1C. The feedback circuit 220 can be the feedback circuit 120 implemented as an active integrator similar to the active integrator 120' described above in connection with FIG. 1D. In the example illustrated in FIG. 2, a first feedback input X of the feedback circuit 220 is connected to the first output $O_1$ of the amplification system 200; a second feedback input Y of the feedback circuit 220 is connected to the second input $I_2$ of the amplification system 200; a third feedback input W of the feedback circuit 220 is connected to the second output $O_2$ of the amplification system 200; and a feedback output of the feedback circuit 220 is connected to the inverting input $N_1$ of the amplifier 210.

Further in the example illustrated in FIG. 2, the audio source 240 is a microphone circuit including a field effect transistor (FET) 244 configured to convert sound signals captured by a microphone to audio signals. The FET 244 is biased by a voltage source $V_{BIAS}$ via a bias resistor $R_{BIAS}$. The first input $I_1$ of the amplification system 200 is connected to a first node of the microphone circuit 240 on the drain side of the FET 244, and the second input $I_2$ of the amplification system 200 is connected to a second node of the microphone circuit 240 on the source side of the FET 244 (which, here, it is connected to ground.) In this manner, there is a finite (non-zero) DC voltage bias U between the first input voltage $V_{in1}(t)$ and the second input voltage $V_{in2}(t)$ which depends at least on combination of a value of the voltage source $V_{BIAS}$ and a value of the bias resistor $R_{BIAS}$. Because this combination can vary between different types/brands of microphones, the DC voltage bias U between the first input voltage $V_{in1}(t)$ applied at the first input $I_1$ of the amplification system 200 and the second input voltage $V_{in2}(t)$ applied at the second input $I_2$ of the amplification system 200 is treated as an unknown DC component U of the first input voltage $V_{in1}(t)$.

As described above in connection with FIG. 1A, the feedback circuit 220 low-pass filters the amplified differential voltage $V_{out1}(t)$-$V_{out2}(t)$ issued by the amplification system 200 at the differential outputs $O_1$ and $O_2$ to generate a filtered signal that includes only components with frequencies less than a cutoff frequency $f_C$. As the amplification system 200 is applied here to audio signals, the cutoff frequency is chosen to be between 20-200 Hz. The filtered signal is provided by the feedback circuit 220 through the feedback output Z at the inverting input $N_1$ of the amplifier 200. As noted above, the feedback circuit 220 is implemented as an active integrator. As the active integrator continues to integrate the signals input at the feedback inputs X, Y and W of the feedback circuit 220, a DC component $V_{N1}$ of the filtered signal provided, by the feedback circuit 220 through the feedback output Z, at the inverting input $N_1$ of the amplifier 210 continues to increase until it reaches a value equal to the unknown DC component U of the first input voltage $V_{in1}(t)$ applied at the first input $I_1$ of the amplification system 200. Once $V_{N1}$ reached the value U, the unknown DC component U at the non-inverting input of the amplifier 210 is counterbalanced by the DC component $V_{N1}$≈U at the inverting input of the amplifier 210. From there on, the DC component $V_{N1}$ will remain constant at the value U, and the amplifier 210 will amplify only components of the input signal that have finite frequencies, f≠0.

In some implementations, detection of the unknown DC component U at the non-inverting input of the amplifier 210 can be used to infer whether the audio source 240 is connected to the amplification system 200. A (partial or full) power state of the amplification system 200 may be controlled based on such inference. For example, if an unknown DC component U detected at the non-inverting input of the amplifier 210 meets a target bias value, then the amplifier 210, the feedback circuit 220 or both can be turned ON (or maintained in a powered-ON state). As another example, if the unknown DC component U detected at the non-inverting input of the amplifier 210 does not meet the target bias value, then the amplifier 210, the feedback circuit 220 or both can be turned OFF (or maintained in a powered-OFF state).

The amplification system 200 and the ADC 250 of the audio processing system 201 (and optionally additional circuitry to determine whether an audio source is connected to the audio processing system 201) can be integrated into an integrated circuit, a system on a chip, or the like. Prior to describing an example of an integrated audio codec that includes an amplifier system in accordance with the disclosed technologies, a conventional integrated audio codec is described below.

Figure 3:
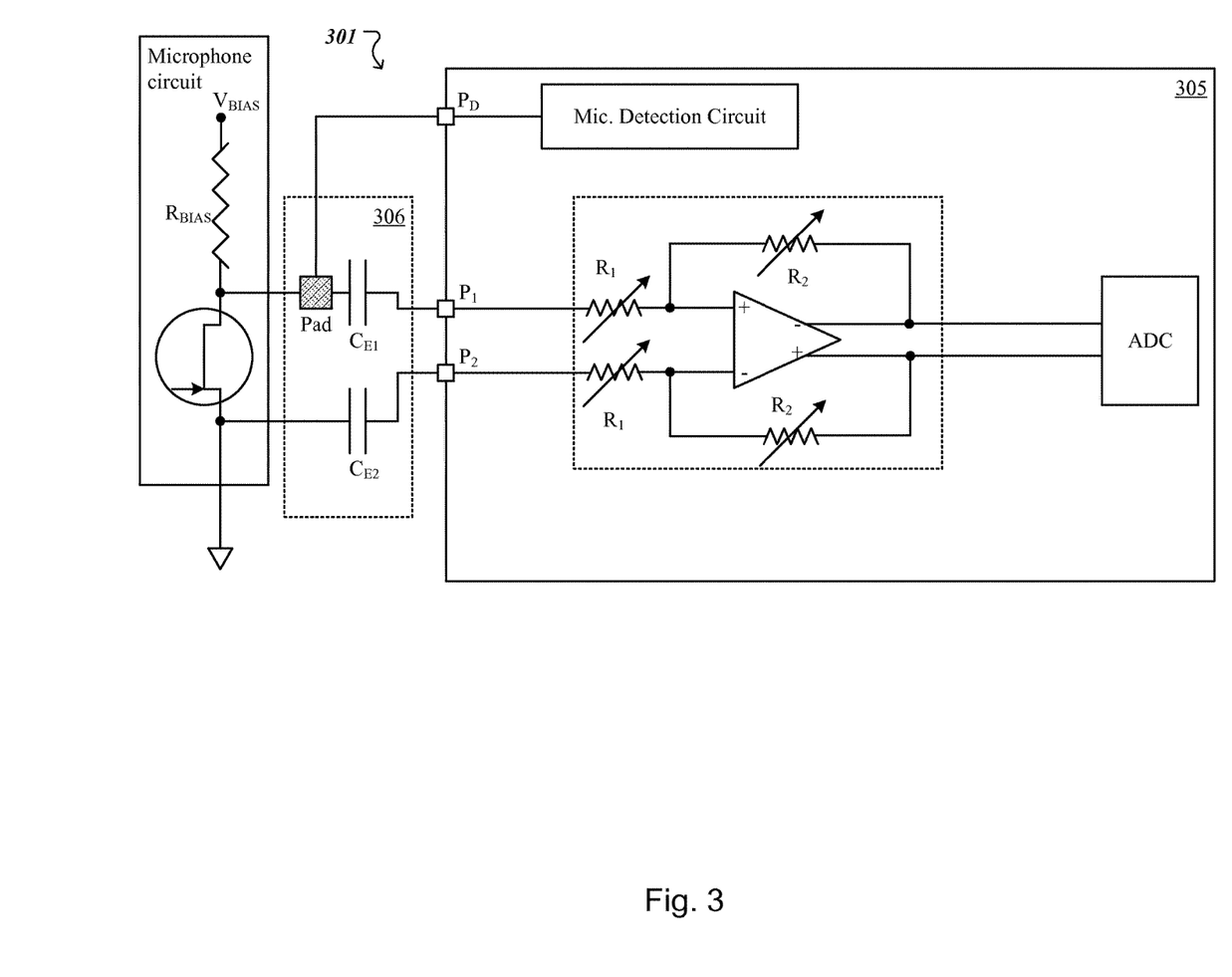
FIG. 3 shows an example of a conventional integrated audio codec.

FIG. 3 shows a portion of a mobile device 301 including a conventional integrated audio codec 305 and a microphone circuit associated with an external analogue microphone. The conventional integrated audio codec 305 includes a programmable gain amplifier (represented as a dotted box) and an ADC. The microphone circuit provides a differential audio signal that is AC-coupled to the conventional integrated audio codec 305. Here, the AC-coupling is accomplished with external capacitors $C_{E1}$ and $C_{E2}$ connected between two nodes of the microphone circuit and respective pins (or ports) $P_1$ and $P_2$ of the conventional integrated audio codec 305. Capacitance values of the external capacitors $C_{E1}$ and $C_{E2}$ range from 100 nF and 2 µF. Such big capacitance values are needed to high pass filter the input differential signal with very low 3 dB cut-off frequency $f_C$ in the range of 20-200 Hz. As high capacitance values can be achieved by using large-size capacitors, the capacitors $C_{E1}$ and $C_{E2}$ are placed outside of the conventional integrated audio codec 305, e.g., on a circuit board 306. In addition, the conventional integrated audio codec 305 includes a microphone detection circuit which compares an unknown DC bias component of the input audio signal to a target bias voltage. As the input audio signal is AC-coupled to the conventional integrated audio codec 305, the audio signal that includes the unknown DC bias component must be provided inside the conventional integrated audio codec 305 through a dedicated pin $P_D$ with which the microphone detection circuit is coupled. Hence, a pad associated with the dedicated pin $P_D$ must be added to the circuit board 306, such that the pad can be reached by the input audio signal prior to reaching the external capacitor $C_{E1}$.

Bill of material costs along with strategies of separating and sizing components of the mobile device 301 are negatively impacted by the need to place external capacitors $C_{E1}$ and $C_{E2}$ on the circuit board 306—outside of the conventional integrated audio codec 305—to AC-couple the input audio signal to the conventional integrated audio codec 305. Further negative impact is created by the need to provide a combination of a pad located on the circuit board 306 and a dedicated pin $P_D$ of the conventional integrated audio codec 305 for detecting the unknown DC bias component of the input audio signal.

The technologies described above in connection with FIGS. 1A, 1D and 2 can be used to modify the conventional integrated audio codec 305 to eliminate a portion of the circuit board 306 that supports the external capacitors $C_{E1}$ and $C_{E2}$ by integrating a high pass filter function within an improved integrated audio codec to allow for the input audio signal to be DC-coupled with the improved integrated audio codec. Moreover, the integrated audio codec improved in this manner manages to remove the dedicated pin $P_D$ of the conventional integrated audio codec 305 and to eliminate another portion of the circuit board 306 that supports the pad associated with the dedicated pin $P_D$ by connecting the microphone detection circuit to the first input pin $P_1$.

Figure 4A:
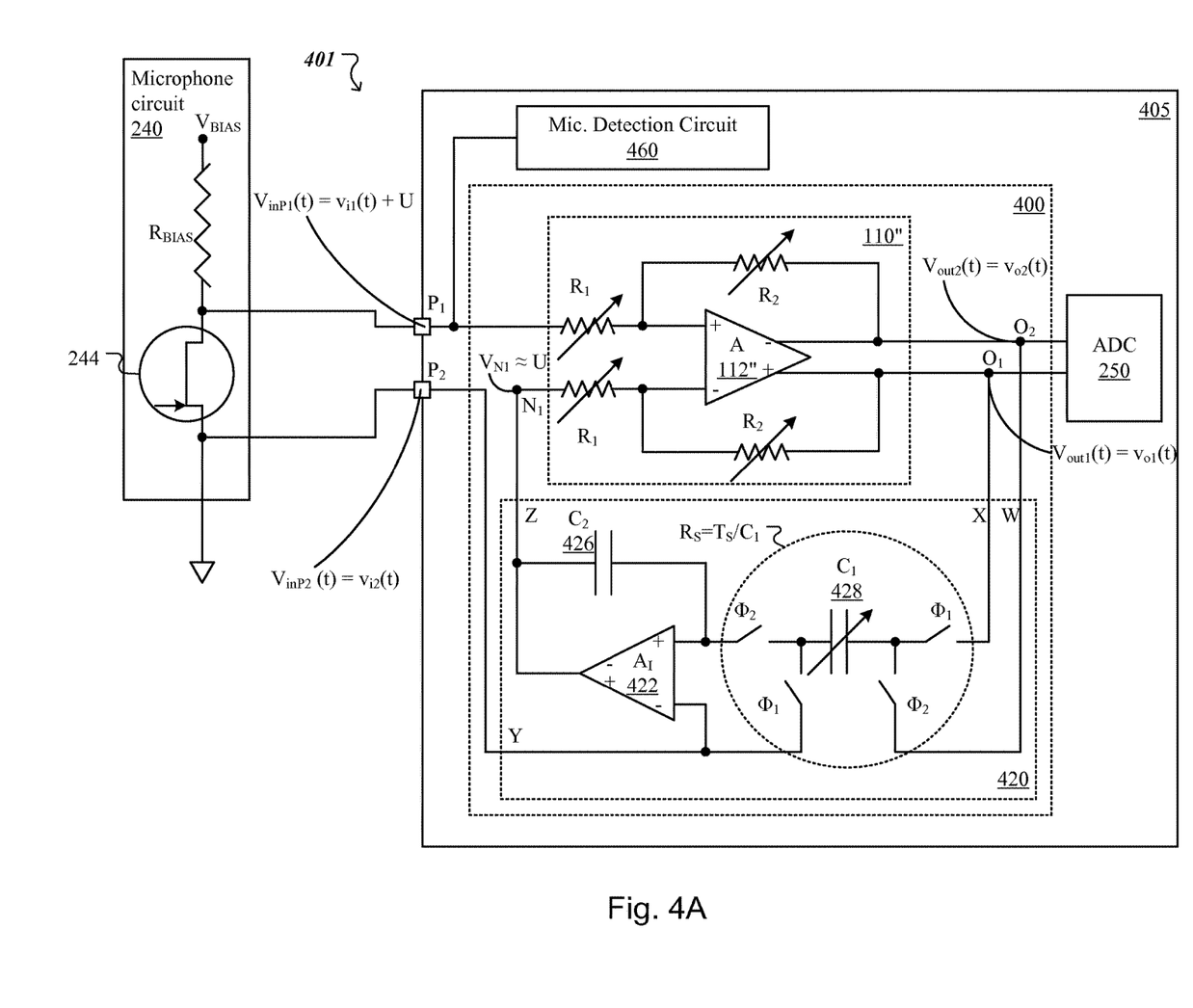
FIGS. 4A-4C show aspects of an example of an integrated audio codec DC-coupled to an audio source that provides a signal with an unknown DC component.

FIG. 4A shows a portion of a mobile device 401 including an integrated audio codec 405 configured in accordance with the disclosed technologies and a microphone circuit 240 associated with an external analogue microphone. The microphone circuit 240 provides an audio signal that is DC-coupled to the integrated audio codec 405. The integrated audio codec 405 includes first and second input pins (or ports) $P_1$ and $P_2$, an amplification system 110" and an ADC 250. Here, the audio signal includes an unknown DC component and is provided as an input differential voltage $V_{inP1}(t)-V_{inP2}(t)$ over the first and second input pins $P_1$ and $P_2$ of the integrated audio codec 405. In this example, the first and second input pins $P_1$ and $P_2$ represent the differential inputs of the amplification system 400. An amplified differential voltage $V_{out1}(t)-V_{out2}(t)$ issued by the amplification system 400 at differential outputs $O_1$ and $O_2$ is converted by the ADC 250 to a digital signal.

The amplification system 400 can be implemented as an integrated version of the amplification system 100 described above in connection with FIGS. 1A-1D. Here, the amplification system 400 includes an amplifier 110" with gain G and a feedback loop 420. The amplifier 110" is implemented as a programmable, fully-differential amplifier as described above in connection with FIG. 1C. For example, the gain G can be adjusted to be G=1 . . . 10. In the example illustrated in FIG. 4A, a first feedback input X of the feedback loop 420 is connected to the first output $O_1$ of the amplification system 400; a second feedback input Y of the feedback loop 420 is connected to the second input pin $P_2$ of the integrated audio codec 405; a third feedback input W of the feedback loop 420 is connected to the second output $O_2$ of the amplification system 400; and a feedback output of the feedback loop 420 is connected to the inverting input $N_1$ of the amplifier 110".

Figure 4B:
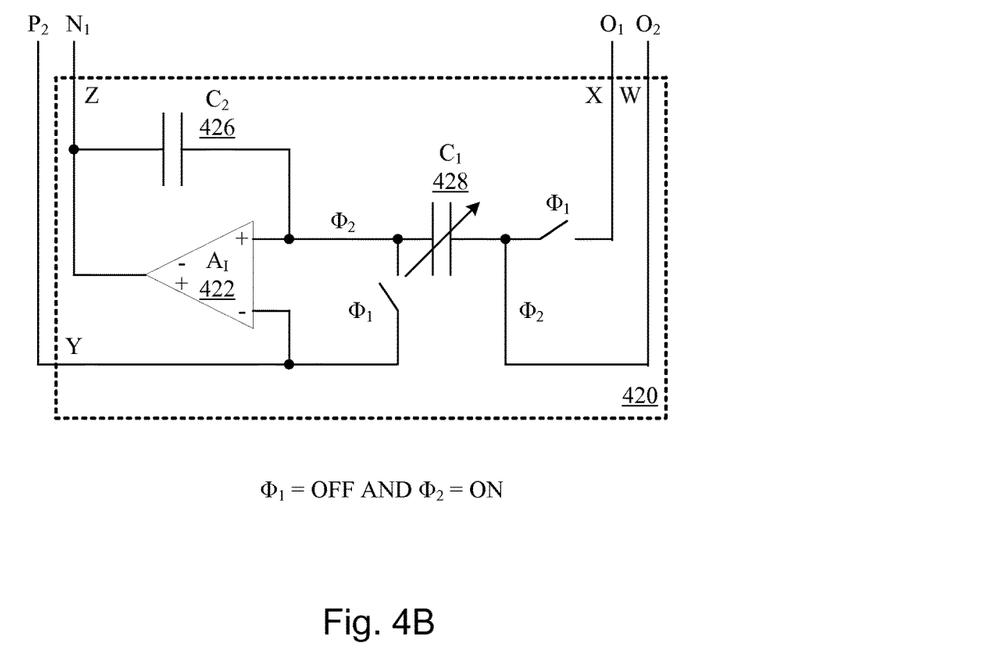
Figure 4C:
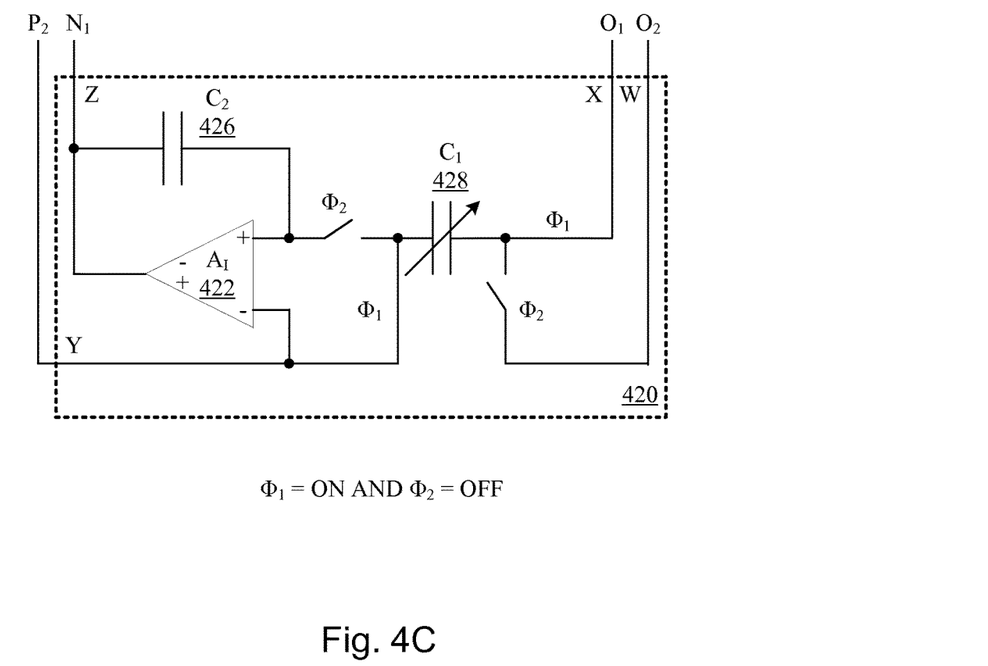

The feedback loop 420 is implemented as an active integrator similar to the active integrator 120' described above in connection with FIG. 1D. The feedback loop 420 includes an operational amplifier 422 having an open-loop gain $A_1$. Here, the operational amplifier 422 is implemented as a fully-differential operational amplifier operated in single ended mode. Further, the feedback loop 420 includes a capacitive element 428 having a capacitance $C_1$ that is switched with a period $T_S$ with switches $\Phi_1$ and $\Phi_2$, such that the switched capacitor 428 has an effective resistance $R_S = T_S/C_1$. FIG. 4B shows that when the switches $\Phi_1$ are OFF and the switches 112 are ON, the switched capacitor 428 is connected between the third feedback input W of the feedback loop 420 and a non-inverting input of the operational amplifier 422. FIG. 4C shows that when the switches $\Phi_1$ are ON and the switches $\Phi_2$ are OFF, the switched capacitor 428 is connected between the first feedback input X of the feedback loop 420 and an inverting input of the operational amplifier 422. The above operation of the switches $\Phi_1$ and $\Phi_2$ associated with the switched capacitor 428 beneficially allows for the fully-differential operational amplifier 422 to operate in single ended mode. In this manner, a dedicated stage of the fully-differential operational amplifier 422 can be omitted and, as a consequence, area and power consumption of the integrated audio codec 405 also is saved.

Note that in the examples illustrated in FIGS. 4A-4C, the second feedback input Y of the feedback loop 420 also is connected to the inverting input of the operational amplifier 422. Moreover, the feedback loop 420 also includes a capacitive element 426 having a capacitance $C_2$ and being connected between the non-inverting input of the operational amplifier 422 and the feedback output Z of the feedback loop 420.

Referring again to FIG. 4A, the microphone circuit 240 includes a FET 244 configured to convert sound signals captured by a microphone to audio signals. The FET 244 is biased by a voltage source $V_{BIAS}$ via a bias resistor $R_{BIAS}$. The first input pin $P_1$ of the integrated audio codec 405 is connected to a first node of the microphone circuit 240 on the drain side of the FET 244, and the second input pin $P_2$ of the integrated audio codec 405 is connected to a second node of the microphone circuit 240 on the source side of the FET 244 (which, here, it is connected to ground.) In this manner, there is a finite (non-zero) DC voltage bias U between the first input voltage $V_{in1}(t)$ and the second input voltage $V_{in2}(t)$ which depends at least on combination of a value of the voltage source $V_{BIAS}$ and a value of the bias resistor $R_{BIAS}$. Because this combination can vary between different types/brands of microphones, the DC voltage bias U between the first input voltage $V_{in1}(t)$ applied at the first input pin $P_1$ of the integrated audio codec 405 and the second input voltage $V_{in2}(t)$ applied at the second input pin $P_2$ of the integrated audio codec 405 is treated as an unknown DC component U of the first input voltage $V_{in1}(t)$.

A transfer function of the amplification system 400 having the amplifier 110" with programmable gain G and the feedback loop 420 implemented as an active integrator—with the switched capacitor 428 and the capacitive element 426—can be expressed as:

$$\frac{V_{out,diff}}{V_{in,se}} = \frac{sG}{s + \frac{GC_1}{T_S C_2}}. \quad (4)$$

Equation (4) indicates that the transfer function of the amplification system 400 is zero at DC (for s=0) and has a pole at $GC_1/T_S C_2$. As such, the amplification system 400 having a transfer function given by Equation (4) operates like an active high pass filter with a cutoff frequency $f_C = GC_1/T_S C_2$. As the gain G of the programmable gain amplifier 110" can be changed in a programmable manner, the product $GC_1$ must be maintained constant in order for the cutoff frequency $f_C$ of the amplification system 400 to remain constant. This can be accomplished by using a switch capacitor 428 with adjustable capacitance $C_1$.

As described above in connection with FIG. 1A, the feedback loop 420 low-pass filters the amplified differential voltage $V_{out1}(t)-V_{out2}(t)$ issued by the amplification system 400 at differential outputs $O_1$ and $O_2$ to generate a filtered signal that includes only components with frequencies less than the cutoff frequency $f_C$. As the amplification system 400 is applied here to audio signals, the cutoff frequency is between 20-200 Hz. The filtered signal is provided by the feedback loop 420 through the feedback output Z at the inverting input $N_1$ of the amplifier 110". As noted above, the feedback loop 420 is implemented as an active integrator. As the active integrator continues to integrate the signals input at the feedback inputs X, Y and W of the feedback loop 420, a DC component $V_{N1}$ of the filtered signal provided, by the feedback loop 420 through the feedback output Z, at the inverting input $N_1$ of the amplifier 110" continues to increase until it reaches a value equal to the unknown DC component U of the first input voltage $V_{in1}(t)$ applied at the first input pin $P_1$ of the integrated audio codec 405. Once $V_{N1}$ reached the value U, the unknown DC component U at the non-inverting input of the amplifier 110" is counterbalanced by the DC component $V_{N1} \approx U$ at the inverting input of the amplifier 110". From there on, the DC component $V_{N1}$ will remain constant at the value U, and the amplifier 110" will amplify only components of the input signal that have finite frequencies, $f \neq 0$.

In this manner, as the amplification system 400 operates as an active high pass filter, an offset of the feedback loop 420 is, advantageously, not critical and, hence, the only constraint of the amplification system 400 is a dynamic range of the amplifier 110". Moreover, because a portion of the input signal $V_{inP1}(t)$-$V_{inP2}(t)$ that includes components with frequencies larger than the cutoff frequency $f_C$ is blocked by (and, thus, does not go through) the feedback loop 420, the requirement that the feedback loop 420 operates in a linear regime can be removed. Beneficially, this allows use of smaller and less expensive components for the feedback loop 420. For example, the capacitive element 426 can be implemented as a metal-oxide-semiconductor (MOS) capacitor in the feedback loop 420. Although MOS capacitors have less linear characteristics than metal-oxide-metal (MOM) capacitors, MOS capacitors are smaller than MOM capacitors. In this manner, the extra silicon area of the feedback loop 420 and the extra cost added by the feedback loop 420 to the integrated audio codec 405 relative to the area and cost of the conventional integrated audio codec 305 can be kept below threshold values.

Noise provided by the feedback loop 420 to the non-inverting input $N_1$ of the amplifier 110″ has a contribution from the operational amplifier 422 and a $k_B T/C_2$ contribution.

As the operational amplifier 422 has a unitary transfer function, its noise contribution can be mitigated by using a low noise operational amplifier for which the total noise integrated between the cutoff frequency $f_C$ and a maximum frequency $f_{MAX}$ of a frequency range $[f_C, f_{MAX}]$ of interest is less than a maximum acceptable noise value of $2\mu V_{RMS}$, for instance. As the amplification system 400 is used to amplify voice signals received from the microphone circuit 240, when the audio signals include an unknown DC, the frequency range $[f_C, f_{MAX}]$ of interest is a voice frequency range starting at about 200 Hz and extending up to 8 kHz, for instance.

The $k_B T/C$ noise contribution introduced by the feedback loop 420 is given by $$V_{n,input}^2 = \frac{2k_B T}{\pi C_2 G} \int_{\frac{2f_1 \pi T_S C_2}{C_1}}^{\frac{2f_2 \pi T_S C_2}{C_1}} \frac{dt}{G\left(1 + d - d\cos\left(\frac{C_1 t}{C_2}\right)\right)}, \quad (5)$$

where parameter d is given by $$d = \frac{2C}{C_1 G} + 2\left(\frac{C}{C_1 G}\right)^2. \quad (6)$$

Note that if the integration in Equation (5) is performed from DC ($f_1=0$) to very large frequencies ($f_2\to\infty$), then the noise value is $(1/G)(k_B T/C_2)$. As such, the $k_B T/C$ noise contribution can be mitigated by using a minimum capacitance $C_2$ for which this noise contribution is less than a maximum acceptable noise value in a range of $2\text{-}5\mu V_{RMS}$. Using the Equations (5) and (6) for the configuration of the feedback loop 420 illustrated in FIG. 4A, the capacitance $C_2$ of the capacitive element 426 is found to be in a range of 10-45 pF.

To avoid noise contributions to the output signal $V_{out1}(t)$-$V_{out2}(t)$ due to switching the switched capacitor 428 at a switching frequency $1/T_S$, the latter can be set ten times larger than the maximum frequency $f_{MAX}$ of the audio range of interest. For example, because here $f_{MAX}$ for the voice frequency range is 8 kHz, the switching frequency $1/T_S$ is chosen to be 80 kHz.

The capacitance $C_1$ of the switched capacitor 428 is determined based on the cutoff frequency $f_C$ of the amplification system 400 (e.g., 25 Hz), the capacitance $C_2$ found above using the Equations (5) and (6) (e.g., 45 pF), the switching frequency $1/T_S$ (e.g., 80 kHz), and the adjustable gain G (e.g., 1 . . . 10) of the amplifier 110″. In this manner, the capacitance $C_1 = f_C T_S C_2/G$ of the switched capacitor 428 is in the range of 8 . . . 80 fF. As the cutoff frequency $f_C$ has to remain constant, the product $GC_1$ is kept constant. So, large values of the gain G (e.g., 10) correspond to small values of the capacitance $C_1$ (e.g., 8 fF), and small values of the gain G (e.g., 1) correspond to larger values of the capacitance $C_1$ (e.g., 80 fF).

Note that an equivalent resistance $R_S$ of the active integrator implemented by the feedback loop 420 is larger than 500 MΩ. For instance, if the cutoff frequency $f_C$=20 Hz, the capacitance which determines the noise contributed by the feedback loop 420 is $C_2$=45 pF and the gain of the amplifier 110″ is G=10, then the equivalent resistance $R_S$ is 1.5 GΩ. A resistor having such a large resistance requires a very large area and would increase the overall silicon area of an active integrator. Hence, the feedback loop 420 is implemented with a switched capacitor 428 having a capacitance $C_1$=8 fF. Such a small switched capacitor 428, even together with the two switches $\Phi_1$ and two switches $\Phi_2$, advantageously requires a much smaller area than a single resistor with resistance of 1.5 GΩ.

A key advantage of the disclosed technologies is that the amplification system 400 of the integrated audio codec 405 can operate like an active high pass filter with a cutoff frequency $f_C$ 25 Hz while causing an overall reduction of an area of the portion of the mobile device 401—which includes the integrated audio codec 405 DC-coupled to an audio signal source—relative to the corresponding portion of the mobile device 301—which includes the conventional integrated audio codec 305 AC-coupled to the audio signal source via external capacitors $C_{E1}$ and $C_{E2}$. This overall area reduction is due to the fact that extra silicon area added by the feedback loop 420 to the integrated audio codec 405 is smaller than an area saved from the portion of the mobile device 401, where the saved area corresponds to a portion of the circuit board 306 occupied by the external capacitors $C_{E1}$ and $C_{E1}$ required by the conventional integrated audio codec 305.

In the example illustrated in FIG. 4A, the integrated audio codec 405 further includes a microphone detection circuit 460. The microphone detection circuit 460 is configured to compare an unknown DC component U of the input voltage $V_{inP1}(t)$ applied at the first input pin $P_1$ of the integrated audio codec 405 to a target bias voltage $V_T$. Detection of the unknown DC component U by the microphone detection circuit 460 at the first input pin $P_1$—which is connected to the non-inverting input of the amplifier system 400—is used by the integrated audio codec 405 to infer whether the microphone circuit 240 is connected to the integrated audio codec 405. A power state of the amplification system 400 can be controlled based on such inference. For example, when the amplifier 110″, the feedback circuit 420 or both are in a powered-OFF state, if the unknown DC component U detected by the microphone detection circuit 460 at the first input pin $P_1$ meets the target bias voltage $V_T$, then the amplifier 110″, the feedback circuit 420 or both are turned ON. As another example, when the amplifier 110″, the feedback circuit 420 or both are in a powered-ON state, if the unknown DC component U detected by the microphone detection circuit 460 at the first input pin $P_1$ does not meet the target bias voltage $V_T$, then the amplifier 110″, the feedback circuit 420 or both are turned OFF.

As the microphone detection circuit 460 detects the unknown DC component U of the input voltage $V_{inP1}(t)$ at the first input pin $P_1$, the integrated audio codec 405 can have one fewer pins than the conventional integrated audio codec 305 in which the microphone detection circuit requires its own dedicated pin $P_D$. As the integrated audio codec 405 has one fewer pins than the conventional integrated audio codec 305, an area of the circuit board 306 occupied by a pad associated with the dedicated pin $P_D$ can be further saved from the overall area of the mobile device 401 which includes the integrated audio codec 405 DC-coupled to an audio signal source.

Figure 5:
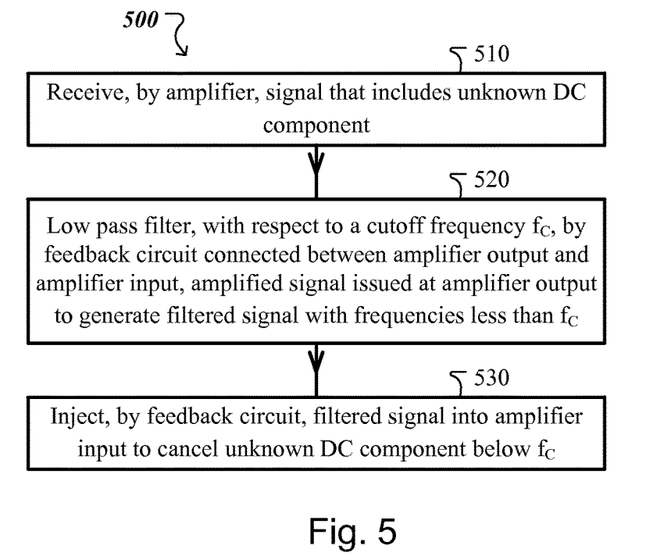
FIG. 5 is a flow chart showing an example of a process for amplifying a signal that includes an unknown DC component.

FIG. 5 is a flow chart showing an example of a process 500 for amplifying a signal that includes an unknown DC component. The process 500 can be implemented, for example, using any of the amplification systems 100, 200 or 400 described above in connection with FIGS. 1A, 2 and 4A.

At 510, a signal that includes an unknown DC component is received by an amplifier. In examples illustrated in FIGS. 2 and 4A, the signal is an audio signal having frequencies in the range of 200 Hz to 20 kHz.

At 520, an amplified signal issued at an output of the amplifier is low pass filtered, with respect to a cutoff frequency $f_C$, by a feedback circuit connected between the output of the amplifier and an input of the amplifier, to generate a filtered signal with frequencies less than the cutoff frequency $f_C$. In some implementations, the cutoff frequency $f_C$ with respect to which the low pass filtering is performed is less than a lower bound of a frequency spectrum of the received signal. For instance, if the received signal is a voice audio signal with frequencies in a frequency range of [200 Hz, 20 kHz] like in the examples illustrated in FIGS. 2 and 4A, then the cutoff frequency is chosen to be $f_C=20$ Hz.

At 530, the filtered signal is injected, by the feedback circuit, into the input of the amplifier to cancel the unknown DC component below the cutoff frequency $f_C$. Here, a ratio of noise generated by the feedback circuit to a portion of the received signal having frequencies above the cutoff frequency $f_C$ can be maintained by the feedback circuit below a predetermined ratio value. In the example illustrated in FIG. 4A, this is accomplished by sizing an integrator capacitance of the feedback circuit at a minimum value (e.g., $C_2=45$ pF for the feedback loop 420 of the integrated audio codec 405.) Further, a switched capacitor of the feedback circuit can be switched at frequencies larger by a predetermined factor than an upper bound of a frequency spectrum of the received signal. In the example illustrated in FIG. 4A, if the received signal is a voice audio signal with frequencies in a frequency range of [200 Hz, 8 kHz], then the switched capacitor $C_1$ is switched at a frequency $f_S=1/T_S=80$ kHz.

In some implementations, a differential amplified signal can be issued at differential outputs of the amplifier. Here, the differential amplified signal can be converted to a digital signal by an analog-to-digital convertor.

Figure 6:
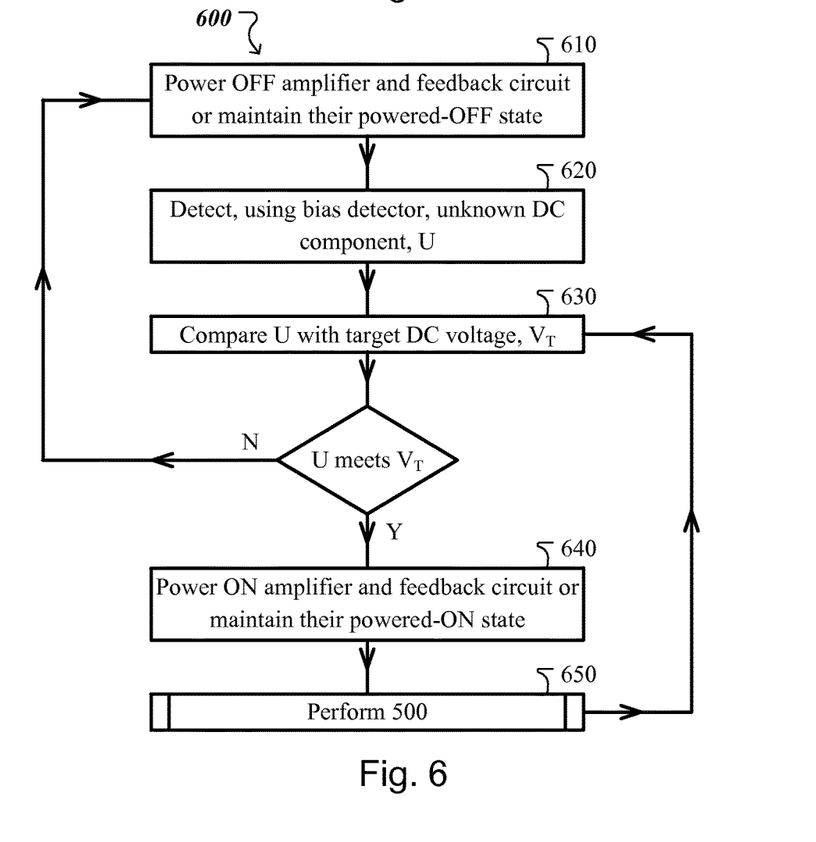
FIG. 6 is a flow chart showing an example of a process for controlling power to, at least, a portion of an integrated audio codec that executes the process illustrated in FIG. 5.

FIG. 6 is a flow chart showing an example of a process 600 for controlling power to, at least, a portion of an integrated audio codec that executes the process 500. The process 600 can be implemented using the integrated audio codec 405 described above in connection with FIG. 4A.

At 610, when an amplifier and a feedback circuit of an integrated audio codec are in a powered-ON state, the amplifier and the feedback circuit are powered OFF. Alternatively, when the amplifier and the feedback circuit are in a powered-OFF state, the powered-OFF state of the amplifier and the feedback circuit is maintained.

At 620, an unknown DC component U is determined by a bias detector of the integrated audio codec. In the example illustrated in FIG. 4A, the bias detector is implemented as a microphone detection circuit 460 of the integrated audio codec 405. Advantageously, the microphone detection circuit 460 detects the unknown DC component U at the same pin at which an input signal which contains the unknown DC component is applied. In this manner, a dedicated pin for detecting the unknown DC component is not required by the integrated audio codec 405.

At 630, the detected unknown DC component is compared with a target DC voltage $V_T$. In some implementations, the target DC voltage $V_T$ is a maximum allowed bias voltage. In other implementations, the target DC voltage $V_T$ is a minimum required bias voltage. In some other implementations, the target DC voltage $V_T$ is a desired range of bias voltages.

If the detected unknown DC component meets the target DC voltage, then, at 640, when the amplifier, the feedback circuit or both are in a powered-ON state, the powered-ON state of the amplifier and the feedback circuit is maintained. Alternatively, at 640, when the amplifier, the feedback circuit or both are in a powered-OFF state, the amplifier and the feedback circuit are powered ON.

At 650, the process 500 is being performed. Once the operations of the process 500 are completed, the process 600 is iterated starting at 630.

Else, if the detected unknown DC component does not meet the target DC voltage, the process 600 is iterated starting at 610.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations, which can include one or more controllers and embedded code.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. An amplification system comprising:
an amplifier configured and arranged to
receive a signal comprising a DC component, and issue an amplified signal; and
a feedback circuit coupled between an output of the amplifier and an input of the amplifier, wherein
the feedback circuit comprises an operational amplifier and a secondary feedback circuit arranged to provide negative feedback to the operational amplifier, the secondary feedback circuit comprising a switched capacitor, and
the feedback circuit is configured to
filter, with respect to a cutoff frequency, the amplified signal issued at the output of the amplifier to generate a filtered signal having frequencies lower than the cutoff frequency, and
inject the filtered signal into the input of the amplifier to cancel the DC component below the cutoff frequency.

2. The amplification system of claim 1, wherein the secondary feedback circuit further comprises an integrator capacitor, such that the operational amplifier and the secondary feedback circuit are arranged as an active integrator circuit.

3. The amplification system of claim 1, wherein
the received signal is a differential voltage across first and second nodes of an electrical circuit, a voltage bias of the first node being higher than a voltage bias of the second node by the DC component of the received signal, and
the amplifier comprises
a non-inverting amplifier input connected to the first node of the electrical circuit, and
an inverting amplifier input, and
the feedback circuit comprises
a first feedback input connected to the output of the amplifier,
a second feedback input connected to the second node of the electrical circuit, and
a feedback output connected to the inverting amplifier input where the filtered signal is injected by the feedback circuit.

4. A method comprising:
receiving, by an amplifier, a signal that comprises a DC component, and issuing an amplified signal;
filtering, with respect to a cutoff frequency, by a feedback circuit that (i) comprises an operational amplifier and a secondary feedback circuit arranged to provide negative feedback to the operational amplifier and (ii) is coupled between an output of the amplifier and an input of the amplifier, the amplified signal issued at the output of the amplifier to generate a filtered signal having frequencies lower than the cutoff frequency, wherein the filtering comprises switching a switched capacitor of the secondary feedback circuit at frequencies larger by a predetermined factor than an upper bound of a frequency spectrum of the received signal; and
injecting, by the feedback circuit, the filtered signal into the input of the amplifier to cancel the DC component below the cutoff frequency.

5. The method of claim 4, comprising maintaining, by the feedback circuit at the input of the amplifier, a ratio of noise generated by the feedback circuit to a portion of the received signal having frequencies above the cutoff frequency below a predetermined ratio value.

6. The method of claim 4, wherein the cutoff frequency with respect to which the filtering is performed is less than a lower bound of a frequency spectrum of the received signal.

7. The method of claim 4, comprising:
issuing, by the amplifier, two amplified signals at respective outputs of the amplifier; and
converting, by an analog-to-digital convertor connected with the outputs of the amplifier, a difference of the amplified signals to a digital signal.

8. The method of claim 4, wherein
the signal is received by the amplifier at a non-inverting input,
the filtered signal is injected by the feedback circuit at an inverting input of the amplifier, and
the method further comprises
determining, by a detection circuit connected to the input of the amplifier, whether the DC component meets a target DC voltage; and
in response to determining that the DC component meets a target DC voltage,
causing that the amplifier, the feedback circuit or both be powered ON or be maintained in a power ON state, or else
causing that the amplifier, the feedback circuit or both to be powered OFF or be maintained in a power OFF state.

9. An integrated circuit comprising:
a first input port and a second input port, wherein the first input port is configured to receive a voltage that comprises a DC voltage; and
an audio codec circuit, wherein the audio codec circuit comprises:
an amplifier comprising an inverting amplifier input, a non-inverting amplifier input, one or more amplifier outputs, and a negative feedback loop,
wherein the non-inverting amplifier input is coupled to the first input port and the negative feedback loop is connected to the second input port, and
wherein the negative feedback loop comprises an active integrator circuit comprising (i) an operational amplifier, (ii) a switched capacitor connected to an inverting input of the operational amplifier, and (iii) an integrator capacitor connected between an output of the operational amplifier and the inverting input of the operational amplifier, the active integrator circuit being configured to generate at the inverting amplifier input a feedback DC voltage that counterbalances the DC voltage, such that one or more amplified voltages issued by the amplifier at the respective one or more amplifier outputs have only components with finite frequencies.

10. The integrated circuit of claim 9, wherein the integrator capacitor is a metal-oxide-semiconductor capacitor.

11. The integrated circuit of claim 9, wherein a capacitance of the integrator capacitor is between 10-45 pF, such that noise generated by the active integrator circuit at the inverting amplifier input is less than $5\mu\ V_{RMS}$.

12. The integrated circuit of claim 9, wherein
an upper bound of a frequency range of the received voltage is in a range of 8-20 kHz, and
the switched capacitor is switched at a switching frequency in the range of 80 kHz to 200 kHz.

13. The integrated circuit of claim 12, wherein
the active integrator is arranged and configured to provide a low pass filter associated with a cutoff frequency to the one or more amplified voltages, and a capacitance of the switched capacitor is in a range of 5-100 fF such that an effective resistance of the switched capacitor causes the cutoff frequency to be less than 200 Hz.

14. The integrated circuit of claim 9, wherein the received voltage is a differential voltage across first and second nodes of a microphone circuit, the first port is connected to the first node of the microphone circuit and the second port is connected to the second node of the microphone circuit, and the negative feedback loop comprises
- a first feedback input connected to one of the one or more amplifier outputs,
- a second feedback input connected to the second port, and
- a feedback output connected to the inverting amplifier input where the DC feedback voltage is generated by the negative feedback loop.

15. The integrated circuit of claim 9, wherein the audio codec circuit further comprises an analog-to-digital converter connected with the one or more amplifier outputs to convert the one or more amplified voltages to corresponding digital signals.

16. The integrated circuit of claim 9, wherein the audio codec circuit comprises a detection circuit connected to the first input port to compare the DC voltage to a target DC voltage, such that the amplifier is to be powered ON or OFF in accordance with a result of the comparison.

17. The integrated circuit of claim 9, wherein the amplifier comprises a programmable gain amplifier.

18. The integrated circuit of claim 9, wherein the amplifier comprises a fully-differential amplifier.

* * * * *